(12) United States Patent
Chu et al.

(10) Patent No.: US 6,855,963 B1
(45) Date of Patent: Feb. 15, 2005

(54) ULTRA HIGH-SPEED SI/SIGE MODULATION-DOPED FIELD EFFECT TRANSISTORS ON ULTRA THIN SOI/SGOI SUBSTRATE

(75) Inventors: Jack O. Chu, Manhasset Hills, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/652,400

(22) Filed: Aug. 29, 2003

(51) Int. Cl.[7] .............................................. H01L 33/00

(52) U.S. Cl. ........................ 257/103; 257/18; 257/19; 257/E29.193; 257/798

(58) Field of Search ................... 257/18, 19, E29.193, 257/798

(56) References Cited

U.S. PATENT DOCUMENTS 6,737,670 B2 * 5/2004 Cheng et al. ................. 257/19

* cited by examiner

*Primary Examiner*—David Nelms
*Assistant Examiner*—Mai-Huong Tran
(74) *Attorney, Agent, or Firm*—Scully, Scott, Murphy & Presser; Robert M. Trepp, Esq.

(57) ABSTRACT

A silicon and silicon germanium based semiconductor MODFET device design and method of manufacture. The MODFET design includes a high-mobility layer structure capable of ultra high-speed, low-noise for a variety of communication applications including RF, microwave, sub-millimeter-wave and millimeter-wave. The epitaxial field effect transistor layer structure includes critical (vertical and lateral) device scaling and layer structure design for a high mobility strained n-channel and p-channel transistor incorporating silicon and silicon germanium layers to form the optimum modulation-doped heterostructure on an ultra thin SOI or SGOI substrate capable of achieving greatly improved RF performance.

74 Claims, 12 Drawing Sheets

ULTRA HIGH-SPEED SI/SIGE MODULATION-DOPED FIELD EFFECT TRANSISTORS ON ULTRA THIN SOI/SGOI SUBSTRATE

This invention was made with Government support under subcontract number N66001-00-8086 awarded by the Defense Advanced Research Projects Agency. The Government has certain rights in this invention.

BACKGROUND OF THE INVENTION

1. Field of the Invention

The present invention relates generally to silicon and silicon germanium based semiconductor transistor devices, and more specifically, to a device design including a grown epitaxial field effect transistor structure capable of ultra high-speed, low-noise for a variety of communication applications including RF, microwave, sub-millimeter-wave and millimeter-wave. Preferably, the epitaxial field effect transistor structure includes the critical device scaling and layer structure design for a high mobility strained n-channel transistor incorporating silicon and silicon germanium layers to form the optimum modulation-doped heterostructure on an ultra thin SOI or SGOI substrate in order to achieve $f_{max}$ in excess of 200 GHz.

2. Description of the Prior Art

The attractiveness of substantial electron mobility enhancement (i.e. 3–5 times over bulk silicon) in modulation-doped tensile-strained Si quantum wells has inspired a long history of device development on Si/SiGe n-channel modulation doped filed-effect transistors (MODFETs). Subsequently, it has been demonstrated that SiGe MODFETs consume lower power and have lower noise characteristics compared to SiGe Heterojunction Bipolar Transistors (HBTs). Similarly, when compared to RF bulk Si CMOS device, SiGe MODFETs still have lower noise characteristics, and higher maximum oscillation frequency ($f_{max}$). Consequently, Si/SiGe MODFETs are becoming more and more attractive devices for high speed, low noise, and low power communication applications, where low cost and compatibility with CMOS logic technology are required and often essential. Recently, n-channel MODFETs with long channel lengths ranging from 0.2 $\mu$m to 0.5 $\mu$m have demonstrated encouraging device performances.

Typically, a Si/SiGe MODFET device have an undoped, tensile strained silicon (nFET) or a compressively strained SiGe (pFET) quantum well channels whereby the induced strain is used to increase the carrier mobility in the channel, in addition to providing carrier confinement The synergistic addition of modulation doping further improves the carrier mobility in the channel by reducing the ionized impurity scattering from the dopants and further reducing the surface roughness scattering in a buried channel. Record high room temperature mobilities of 2800 cm$^2$/Vs have been achieved for electron mobilities in a tensile strained silicon channel grown on a relaxed Si$_{0.7}$Ge$_{0.3}$ buffer. Conversely, very high hole mobility of 1750 cm$^2$/V-s in a pure Ge channel grown on a Si$_{0.35}$Ge$_{0.65}$ buffer has been achieved [R. Hammond, et al, DRC, 1991]. The highest $f_T$ that has been achieved for a strained silicon nMODFET is 90 GHz [M. Zeuner, 2002], and the highest $f_{max}$ is 190 GHz [Koester, et al to be published]. So far, neither $f_T$ nor $f_{max}$ has reached 200 GHz with Si/SiGe MODFETs.

As described in a simulation study conducted by the inventors, in order to achieve higher speed, the MODFET has to be scaled properly, both in the vertical dimensions and the horizontal (or lateral) dimensions. However, it turns out that the scaling of MODFETs is even more challenging than for CMOS scaling due to the following: 1) the horizontal scaling brings the source and drain closer, and, like the case in the CMOS, short-channel effects and bulk punchthrough become the major hurdles preventing the lateral scaling; and, 2) the vertical scaling of the layer structure turns out to be crucial. The lateral scaling alone cannot keep the scaling of the performance. However, the vertical scaling of the MODFET structures to reduce the depth of the quantum well ($d_{QW}$) is quite challenging, particularly due to the scaling and abruptness of the n+ supply layer, which is typically doped with Phosphorus as explained in the Annual Review of Materials Science, vol. 30, 2000, pp. 348–355. FIG. 6 illustrates a graph 200 of the Phosphorus (P) doping profile for a G1 (generation) layer structure and the steady-state P doping 201 problem and transient P doping problems 202 associated with the Phosphorus doping in a CVD growth system.

It would be highly desirable to provide a scaling technique for MODFET device structures that overcomes the lateral and vertical scaling challenges in the manufacture of MODFET device structures.

It has been further been demonstrated in commonly-owned, co-pending U.S. patent application Ser. No. 10/389,145 entitled "Dual Strain State SiGe Layers for Microelectronics" by J. Chu, et al, filed Mar. 15, 2003, the contents and disclosure of which is incorporated by reference as if fully set forth herein, that MODFETs on a thick Silicon-Germanium-on-Insulator (SGOI) substrate will behave like MODFET on a bulk substrate. Co-pending U.S. patent application Ser. No. 10/389,145 particularly describes a generic MODFET layer structure on a SGOI substrate without specifying the critical layer structure for high performance.

It would be further highly desirable to provide a scaled MODFET device structure that is built on an ultra-thin SiGe-on-insulator (SGOI) substrate, wherein the MODFET device structure exhibits ultra-high speed device performance (e.g., $f_T$, $f_{max}$>300 GHz) with better noise figures, acceptable voltage gain and good turn-off characteristics.

SUMMARY OF THE INVENTION

The invention is directed to a high-electron-mobility n-channel MODFET device that is properly scaled and constructed on a thin SGOI/SOI substrate that exhibits greatly improved RF performance.

The present invention is directed to a MODFET device and method of manufacture that addresses the prior art limitations and achieves vertical scaling of the nMODFET layer structure and the source/drain junction and lateral scaling of the device structure to unprecedented degrees, resulting in a device exhibiting ultra-high speed performance (i.e. $f_T$, $f_{max}$ >300 GHz) with acceptable voltage gain and good turn-off characteristics.

In the method of manufacturing the MODFET device of the invention, the MODFET device is built on an ultra-thin SiGe-on-insulator (SGOI) substrate, such that the body is fully depleted. Due to the suppressed short channel effects, the output conductance (gd) may be thus be reduced. Therefore, the DC voltage gain (gm/gd), the linearity and $f_{max}$ is significantly improved. In addition, the provision of ultra-thin SiGe buffer layers also reduces the self-heating due to the low thermal conductivity of SiGe, which reduces the drive current. Compared to a bulk MODFET, a fully-depleted SGOI MODFET exhibits better noise figures and lower soft error rate. Preferably, the epitaxial field effect transistor structure of the invention includes the critical device scaling and layer structure design for a high mobility strained n-channel transistor incorporating silicon and silicon germanium layers to form the optimum modulation-doped heterostructure on an ultra thin SOI or SGOI substrate in order to achieve $f_{max}$ of >300 GHz.

As studies have shown that the Phosphorus incorporation rate can be controlled by the growth rate (See aforementioned Annual Review of Materials Science, vol. 30, 2000, pp. 348–355), it is thus a further object of the present invention to provide a novel MODFET device structure method of achieving thin SiGe epitaxial layer with an abrupt P doping. In this objective, a novel low temperature growth technique is implemented for achieving abrupt phosphorous doping profiles in order to accommodate and to match the proper vertical scaling or design of the MODFET layer structure required for ultra-high speed performances.

In order to prevent the Phosphorus diffusion during the fabrication process, a small amount of carbon may be incorporated during the epitaxial growth of the SiGe supply layer in the manner as described in commonly-owned, co-pending U.S. patent application Ser. No. 09/838,892 entitled "Epitaxial and Polycrystalline Growth of $Si_{1-x-y}Ge_xC_y$ and $Si_{1-y}C_y$ Alloy Layers on Si by UHV-CVD", the contents and disclosure of which is incorporated by reference as if fully set forth herein.

The invention further is directed to a high-hole-mobility p-channel MODFET that is properly scaled and constructed on a thin SGOI/SOI substrate will also have very high RF performance.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT

Figure 1A:
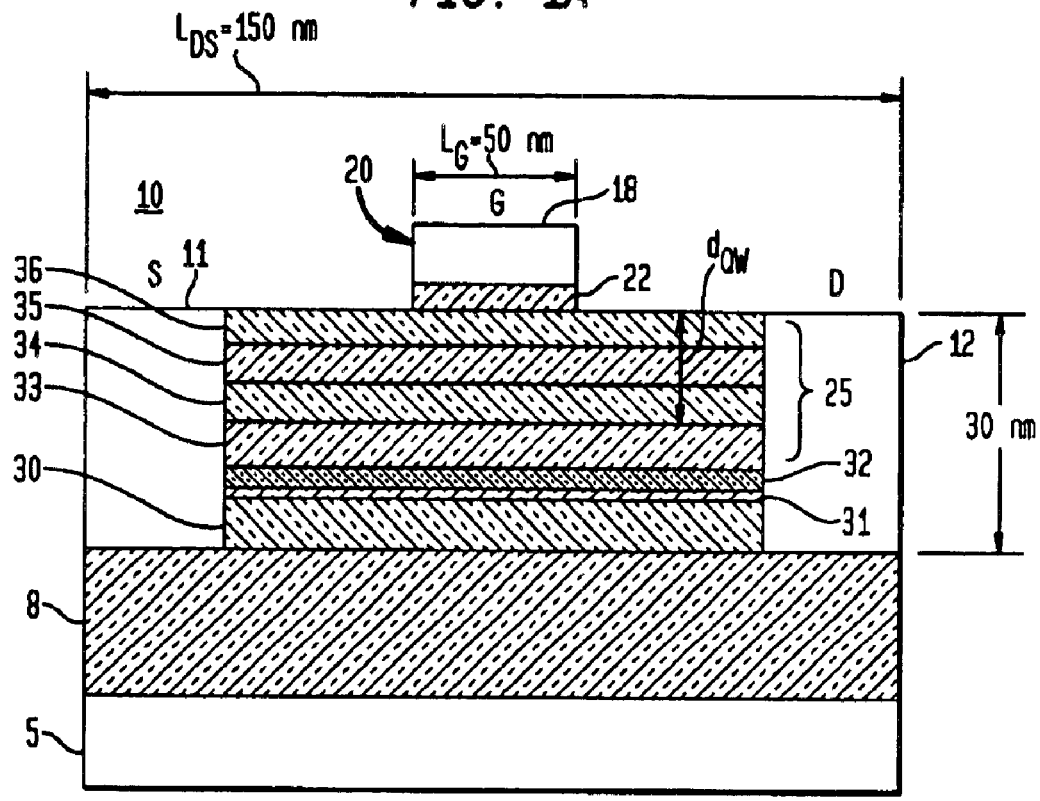
FIGS. 1(a)–1(e) are schematic cross-sectional views showing the inventive Si/SiGe n-type MODFET structure on thin SGOI substrate (G0–G4) properly scaled in accordance with the invention.
Figure 1B:
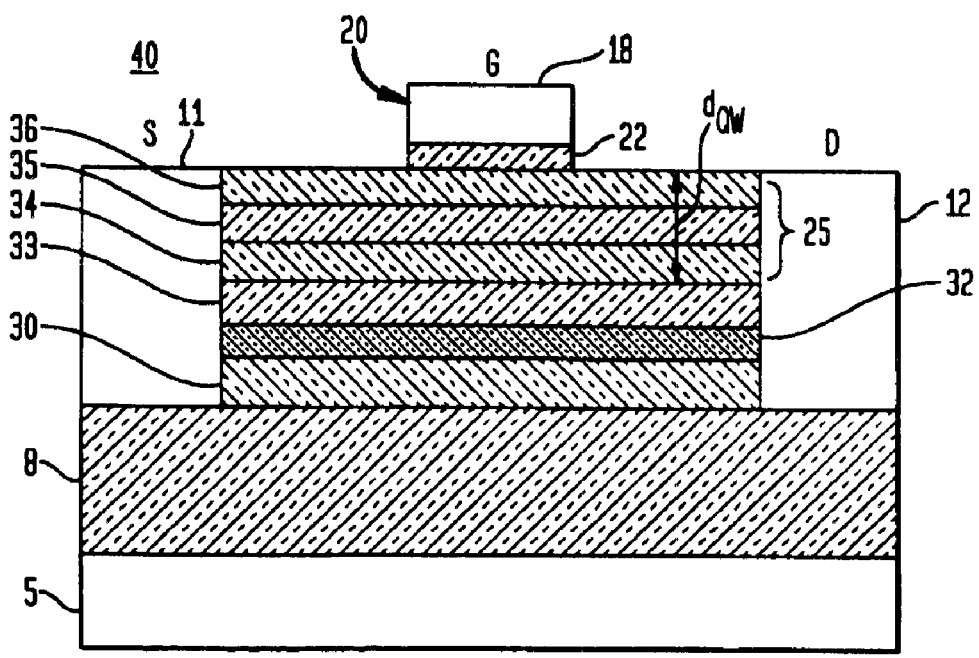
Figure 1C:
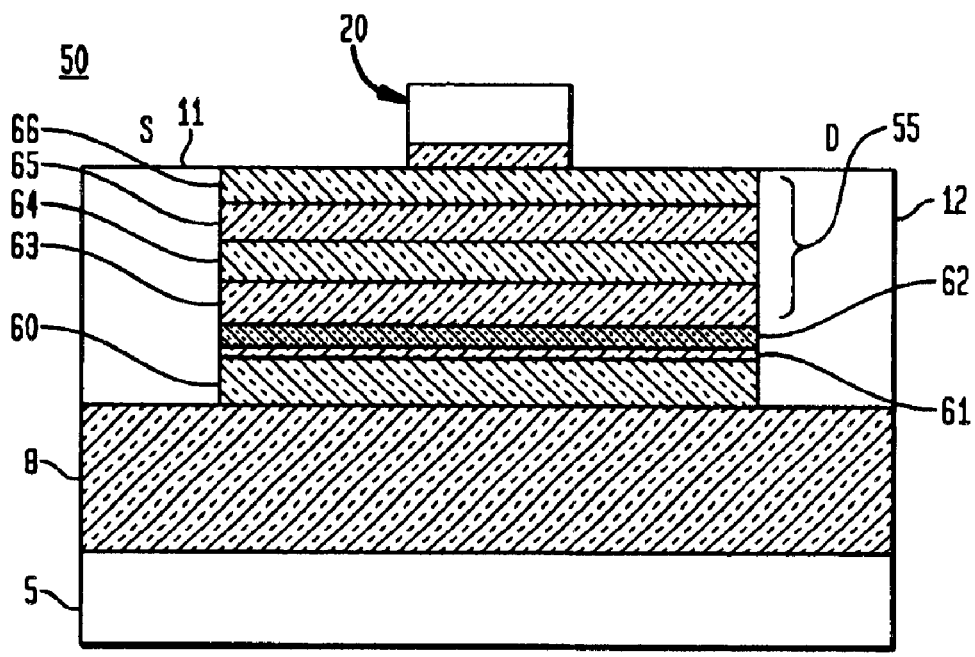
Figure 1D:
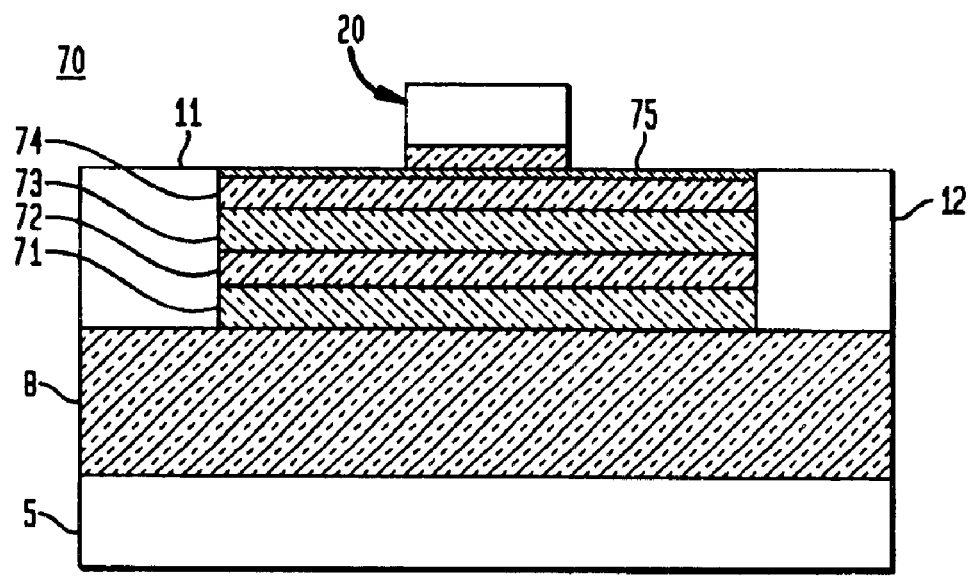
Figure 1E:
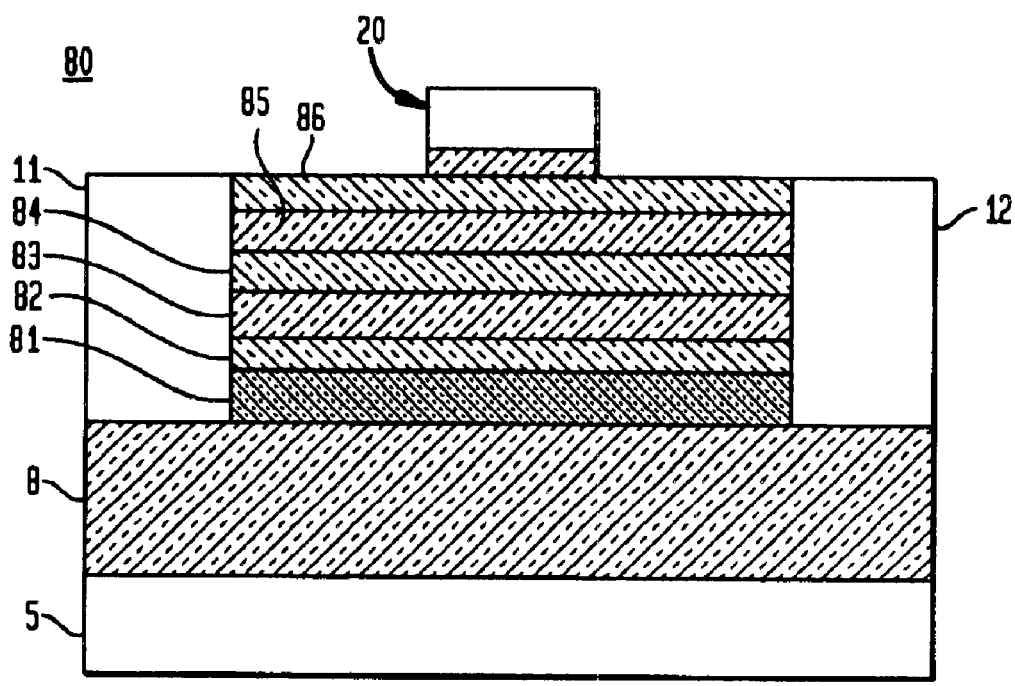
Figure 1F:
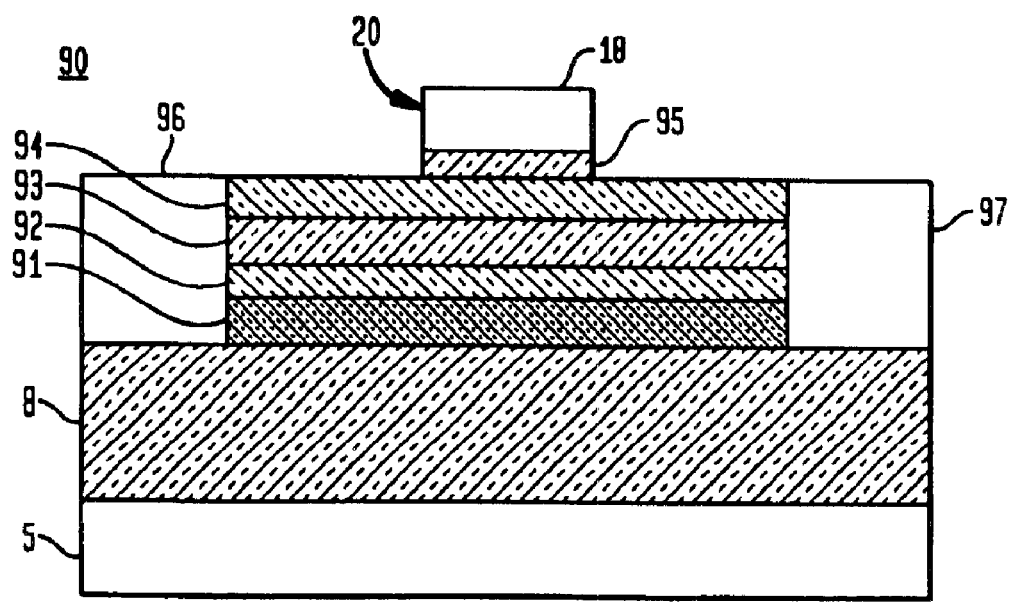
FIG. 1(f) illustrates a Si/SiGe p-type MODFET structure on thin SGOI substrate.

FIGS. 1(a)–1(e) are schematic cross-sectional views showing the inventive Si/SiGe n-type MODFET structures on thin SiGe-on-Insulator (SGOI) substrate (generation G1–G4 devices) properly scaled in accordance with the invention FIG. 1(f) illustrates a Si/SiGe p-type MODFET structure on thin SGOI substrate properly scaled in accordance with the invention.

FIG. 1(a) particularly depicts a MODFET device according to a first embodiment. As shown in FIG. 1(a), there is depicted a top doped nMODFET device 10 comprising a Si substrate layer 5, a buried dielectric layer 8 formed on top of the substrate 5 which may range up to 200 nm in thickness and comprise an oxide, nitride, oxynitride of silicon; and a channel region 25 formed between n+-type doped source and drain regions 11, 12 respectively, and a gate structure 20 including a gate dielectric layer 22 separating the gate conductor 18 from the channel 25. As shown in the figure, the gate dielectric layer may comprise an oxide, nitride, oxynitride of silicon, and oxides and silicates of Hf, Al, Zr, La, Y, Ta, singly or in combinations. It is important to realize that according to the invention, the dimensions of the device including drain, source, gate and channel regions have been scaled.

The composition of the channel region 25 of device 10 in FIG. 1(a) is as follows: A relaxed SiGe layer 30 having a p-type dopant is provided on a buried dielectric layer 8 having Ge content ranging between 30–50% and ranging in thickness between 20 nm–30 nm. The p-type doping concentration ranges between $1e14$ $cm^{-3}$–$5e17$ $cm^{-3}$ using one of: ion implantation or in-situ doping. The relaxed SiGe layer may be predoped to a concentration level of $1e14$ $cm^{-3}$–$5e17$ $cm^{-3}$. Preferably, the relaxed SiGe layer and other layers comprising the channel 25 is grown according to a UHVCVD technique, however other techniques such as MBE, RTCVD, LPCVD processes may be employed. A five percent (5%) SiGe seed layer 31 ($Si_{0.95}Ge_{0.05}$) is then epitaxially grown on top of the relaxed SiGe layer 30 and an intrinsic $Si_{1-x}Ge_x$ regrown buffer layer 32 is formed on top of the formed SiGe seed layer 31. The thickness of epitaxially grown SiGe seed layer ranges from 0 nm–5 nm and the thickness of the intrinsic SiGe regrown buffer layer 32 ranges between 20 nm–30 nm and having Ge content "x" ranging between 10%–40%. An epitaxial tensile strained Si layer 33 is then grown on top of the SiGe buffer layer 32 and ranges in thickness between 5 nm–7 nm. An epitaxial $Si_{1-y}Ge_y$ spacer layer 34 is then formed on top of the strained Si layer and ranging in thickness between 3 nm–5 nm and having Ge content "y" ranging between 30–40%. Then, an epitaxial $Si_{1-z}Ge_y$ supply layer 35 is grown on top of the spacer layer ranging in thickness between 2 nm–8 nm and having a n-type doping concentration ranging between 2e18 $cm^{-3}$–5e19 $cm^{-3}$ and having Ge content "z" ranging between 35–50%. The $Si_{1-z}Ge_z$ supply layer may be grown in a temperature range between 425° C.–550° C. and in-situ doped using phosphine gas as a dopant precursor singly or in a mixture including one or more elements including but not limited to: H2, He, Ne, Ar, Kr, Xe, $N_2$. Preferably, the flow rate of the phosphine gas dopant precursor is a linear ramp or a graded profile such that said in-situ doping is performed without disrupting an epitaxial growth process. It is understood that a precursor such as $AsH_3$ or $SbH_3$ may be used as well. As mentioned herein, in order to prevent the P diffusion during the fabrication process, a small amount of carbon may be incorporated during the epitaxial growth of the SiGe supply layer 34, e.g., a SiGeC layer, having a C content of about 0.1–2%, preferably about 1–1.5%. Finally, an epitaxial tensile strained Si cap layer 36 is grown on top of the supply layer 35 ranging in thickness between 0 nm–3 nm and having a n-type doping concentration ranging between 5e17 $cm^{-3}$–5e19 $cm^{-3}$.

To form the transistor device of FIG. 1(a), the gate dielectric layer 22 is formed on top of the strained Si cap layer and is having an equivalent oxide thickness in a range of 0–1 nm. The gate conductor 18 may have a T-gate geometry, rectangular geometry or a multi-finger geometry formed on top of the gate dielectric layer 22 and may comprise Pt, Ir, W, Pd, Al, Au, Cu, Ti, Co either, singly or in combinations, at lengths ranging between 30 nm–100 nm. The formed drain region 12 has an n-type doping concentration greater than 5e19 $cm^{-3}$; and the formed source region 11 has a n-type doping concentration greater than 5e19 $cm^{-3}$. The distance between the gate conductor 18 and either drain or source region ranges from about 20 nm–100 nm. Although not shown, the device may further comprise a passivation layer surrounding the gate electrode 20, the passivation layer having a permittivity ranging between 1–4. As indicated in FIG. 1(a), the depth of the quantum well, $d_{QW}$ of the formed nMODFET includes the spacer layer of intrinsic SiGe 34, the layer of n+-type doped SiGe 35 and the layer of n+-type doped Si cap layer 36 totaling approximately 10 nm in depth according to the dimensions depicted in FIG. 1(a).

In an alternate embodiment the seed layer 31 of FIG. 1(a) may be omitted. FIG. 1(b) depicts a high-electron-mobility device 40 that is identical to the top-doped nMODFET of FIG. 1(a), however, does not include the seed layer.

FIG. 1(c) illustrates a second embodiment of the invention drawn to a high-electron-mobility nMODFET device 50 that is bottom doped. As shown in FIG. 1c), the device 50 includes a Si substrate layer 5, a buried dielectric layer 8 formed on top of the substrate 5 comprising an oxide, nitride, oxynitride of silicon, for example, and a channel region 55 formed between n+-type doped source and drain regions 11, 12 respectively, and a gate structure 20. The channel structure 55 includes a relaxed SiGe layer 60 on insulator 8 ranging in thickness between 10 mm and 50 nm, an epitaxial $Si_{0.95}Ge_{0.05}$ seed layer 61 grown on top of the SiGe layer 60 and ranging in thickness between 0 nm–5 nm; an epitaxial $Si_{1-z}Ge_z$ supply layer 62 grown on top of the seed layer ranging in thickness between 2 nm–8 nm and having a n-type doping concentration ranging between 1e18 $cm^{-3}$–5e19 $cm^{-3}$; an epitaxial $Si_{1-y}Ge_y$ spacer layer 63 grown on top of the supply layer and ranging in thickness between 3 nm–5 nm; and, an epitaxial tensile strained Si channel layer 64 grown on top of the spacer layer and ranging in thickness between 3 nm–10 nm; an epitaxial $Si_{1-y}Ge_y$ spacer layer 65 grown on top of the strained Si layer and ranging in thickness between 1 nm–2 nm; and, an epitaxial tensile strained Si cap layer 66 grown on top of the spacer layer ranging in thickness between 0 nm–2 nm. As in the first embodiment, a small amount of carbon may be incorporated during the epitaxial growth of the SiGe supply layer 61, e.g., a SiGeC layer, having a C content of about 0.1–2%, preferably about 1–1.5%. Further, with respect to the second embodiment of FIG. 1c) all the gate conductor geometries and distances to respective source/drain regions, the dopant concentrations of the source/drain regions, and the composition of the gate conductor metal and gate dielectric are the same as in the first embodiment (FIG. 1(a)). As indicated in FIG. 1(c), the depth of the quantum well, $d_{QW}$ of the formed nMODFET includes the layer of n+-type doped Si cap layer 66 totaling a depth of approximately 2 nm.

In an alternate embodiment of the structure 50 of FIG. 1(c), the seed layer may be omitted. Thus a resulting structure is a high-electron-mobility device that is identical to the bottom-doped nMODFET of FIG. 1(c), however, does not include the seed layer. In this alternate embodiment, an SGOI substrate comprises: a relaxed SiGe layer on insulator having Ge content ranging between 30–40% and ranging in thickness between 20 nm–30 nm; an epitaxial $Si_{1-z}Ge_z$ supply layer grown on top of the relaxed SiGe layer ranging in thickness between 2.5 nm–8 nm and having a n-type doping concentration "z" ranging between 2e18 $cm^{-3}$–2e19 $cm^{-3}$ and having Ge content ranging between 35–50%; an epitaxial $S_{1-y}Ge_y$ spacer layer grown on top of the supply layer and ranging in thickness between 3 nm–5 nm and having Ge content "y" ranging between 30–40%; an epitaxial tensile strained Si channel layer grown on top of the spacer layer ranging in thickness between 5 nm–7 nm and having a doping concentration less than 1e16 $cm^{-3}$; an epitaxial $Si_{1-y}Ge_y$ spacer layer grown on top of the Si channel layer and ranging in thickness between 1 nm–2 nm and having Ge content ranging between 30–40%; and, an epitaxial tensile strained Si cap layer grown on top of the spacer layer ranging in thickness between 0 nm–2 nm. A transistor device is completed with the drain source and gate conductor regions as shown and explained with respect to FIG. 1(c).

FIG. 1(d) illustrates a third embodiment of the invention drawn to a high-electron-mobility nMODFET device 70 that is bottom doped and including a doped transferred layer. As shown in FIG. 1(d), the device 70 includes an SGOI substrate comprising a $Si_{1-z}Ge_z$ supply layer 71 ranging in thickness between 2 nm–8 nm and having a n-type doping concentration ranging between 1e18 $cm^{-3}$–5e19 $cm^{-3}$ by ion implantation or in-situ doping; an epitaxial $Si_{1-y}Ge_y$ spacer layer 72 grown on top of the supply layer and ranging in thickness between 3 nm–5 nm; an epitaxial tensile strained Si channel layer 73 grown on top of spacer layer 72 and ranging in thickness between 3 nm–10 nm; an epitaxial $Si_{1-y}Ge_y$ spacer layer 74 grown on top of the strained Si layer 73 and ranging in thickness between 1 nm–2 nm; and, an epitaxial tensile strained Si cap layer 75 grown on top of the spacer layer ranging in thickness between 0 nm–2 nm. Preferably, the doped transferred $Si_{1-z}Ge_z$ supply layer 71 has a Ge content z=x+a, where "a" ranges between about 0–30%, "x" ranges between 30–50%, and may be formed by a wafer bonding and smart-cut process. Alternatively, the $Si_{1-z}Ge_z$ supply layer may be predoped to a concentration level of 1e18–5e19 atoms/cm3 before a layer transfer in forming the SGOI substrate. The doped transferred $Si_{1-z}Ge_z$ supply layer may further comprise a $Si_{1-m-n}Ge_mC_n$ layer, where m=x+b, and "b" ranges between 0–30%, and "n" ranges between 0.1–2%. The $Si_{1-y}Ge_y$ spacer layers 72, 74 includes a Ge content y=x+c, where "c" ranges between 0–20%. Further, with respect to the third embodiment of FIG. 1(d), all the gate conductor geometries and distances to respective source/drain regions, the dopant concentrations of the source/drain regions, and the composition and thicknesses of the gate conductor metal and gate dielectric are as depicted in the first embodiment (FIG. 1(a)). As indicated in FIG. 1(d), the depth of the quantum well, $d_{QW}$ of the formed nMODFET includes the layer of n+-type doped Si cap layer 75 and spacer layer 74 having a depth of less than approximately 4 nm.

FIG. 1(e) illustrates a fourth embodiment of the invention drawn to a high-electron-mobility nMODFET device 80 that is both bottom and top doped and including a SiGe regrown buffer layer. As shown in FIG. 1(e), the nMODFET device 80 includes an SGOI substrate having: a relaxed SiGe layer 81 on insulator 8 ranging in thickness between 10 nm–50 nm, having a n-type doping concentration ranging between 1e17 $cm^{-3}$–5e19 $cm^{-3}$ and a Ge content ranging between 30–50%; a $Si_{1-x}Ge_x$ regrown buffer layer 82 grown on top of the SiGe layer 81 and ranging in thickness between 10 nm–50 nm and serving as a bottom spacer layer and including a Ge content "x" ranging between 10%–35%; an epitaxial tensile strained Si layer 83 grown on top of the regrown buffer layer and ranging in thickness between 3 nm–10 nm; an epitaxial $Si_{1-y}Ge_y$ spacer layer 84 grown on top of the strained Si layer 83 and ranging in thickness between 3 nm–5 nm; an epitaxial $Si_{1-z}Ge_z$ supply layer 85 grown on top of the spacer layer 84 ranging in thickness between 2 nm–8 nm and having a n-type doping concentration ranging between 1e18 $cm^{-3}$–5e19 $cm^{-3}$; and, an epitaxial tensile strained Si cap layer 86 grown on top of the supply layer 85 ranging in thickness between 0 nm–3 nm and having a n-type doping concentration ranging between 5e17 $cm^{-3}$–5e19 $cm^{-3}$. The $Si_{1-y}Ge_y$ spacer layer 84 includes a Ge content y=x+a, where "a" ranges between 0–20% and the $Si_{1-z}Ge_z$ supply layer includes a Ge content z=x+b, where "b" ranges between 0–30%. As in the other embodiments, the $Si_{1-z}Ge_z$ supply layer comprises a $Si_{1-m-n}Ge_mC_n$ layer, where m=x+c, and "c" ranges between 0–20%, and "n" ranges between 0.1–2%. Further, with respect to the fourth embodiment of FIG. 1(e), all the gate conductor geometries and distances to respective source/drain regions, the dopant concentrations of the source/drain regions, and the composition and thicknesses of the gate conductor metal and gate dielectric are as depicted in the first embodiment (FIG. 1(a)). As indicated in FIG. 1(e), the depth of the quantum well, $d_{QW}$ of the formed nMODFET includes the layer of n+-type doped Si cap layer 86, the epitaxial $Si_{1-z}Ge_z$ supply layer 85, and spacer layer 84 for a depth totaling less than or equal to approximately 16 nm.

FIG. 1(f) illustrates a fifth embodiment of the invention drawn to a high-hole-mobility MODFET device 80 that is bottom doped and including a doped transferred layer. As shown in FIG. 1(f), the pMODFET device 90 includes an SGOI (SiGe layer 91 on insulator 8) substrate having: a relaxed epitaxial $Si_{1-j}Ge_j$ supply layer ranging in thickness between 5 nm–25 nm, and having ion-implanted or in-situ p-type doping of a concentration ranging between 1e18–5e19 $cm^{-3}$ and serving as a supply layer. Alternately, the relaxed $Si_{1-j}Ge_j$ layer may be predoped p-type to a concentration level of 1e18–5e19 boron atoms/cm3 before a layer transfer in forming the SGOI substrate; an epitaxial $Si_{1-k}Ge_k$ spacer layer 92 grown on top of the supply layer 91 and ranging in thickness between 3 nm–7 nm; an epitaxial compressively strained $Si_{1-m}Ge_m$ channel layer 93 grown on top of the spacer layer and ranging in thickness between 5 nm–20 nm; and, an epitaxial strained $Si_{1-n}Ge_n$ cap layer 94 grown on top of the strained $Si_{1-m}Ge_m$ channel layer and ranging in thickness between 2 nm–10 nm. In the high-hole-mobility layer semiconductor structure 90 the $Si_{1-j}Ge_j$ supply layer 91 includes a Ge content "j" ranging between 30–70%. The $Si_{1-k}Ge_k$ spacer layer 92 includes a Ge content "k" ranging between 30–70% and, the $Si_{1-m}Ge_m$ channel layer 93 includes a Ge content "m" ranging between 60–100% and the strained $Si_{1-n}Ge_n$ cap layer 94 includes a Ge content n ranging between 0%–30%.

To form the pMODFET transistor device of FIG. 1(f), a gate dielectric layer 95 is formed on top of the strained SiGe cap layer 94 and is having an equivalent oxide thickness in a range of 0–1 nm. The gate conductor 18 may have a T-gate geometry, rectangular geometry or a multi-finger geometry formed on top of the gate dielectric layer 95 and may comprise Pt, Ir, W, Pd, Al, Au, Cu, Ti, Co either, singly or in combinations, at lengths ranging between 30 nm–100 nm. A formed drain region 97 has a p-type doping concentration greater than 5e19 $cm^{-3}$; and the formed source region 96 has a p-type doping concentration greater than 5e19 $cm^{-3}$. The distance between the gate conductor 18 and either drain or source region ranges from about 20 nm–100 nm. Although not shown, the device may further comprise a passivation layer surrounding the gate electrode 20, the passivation layer having a permittivity ranging between 1–4. As indicated in FIG. 1(f), the depth of the quantum well, $d_{QW}$ of the formed pMODFET 90 includes the SiGe cap layer 94 with a range from approximately between 2 nm–10 nm.

Completed devices comprising embodiments depicted in FIGS. 1(a)–1(e) having the different layer structures and design were grown by UHVCVD under growth temperature conditions ranging between 400–600° C., and preferably in a range of 500–550° C. and in a pressure ranging from 1 mTorr–20 mTorr.

Figure 17A:
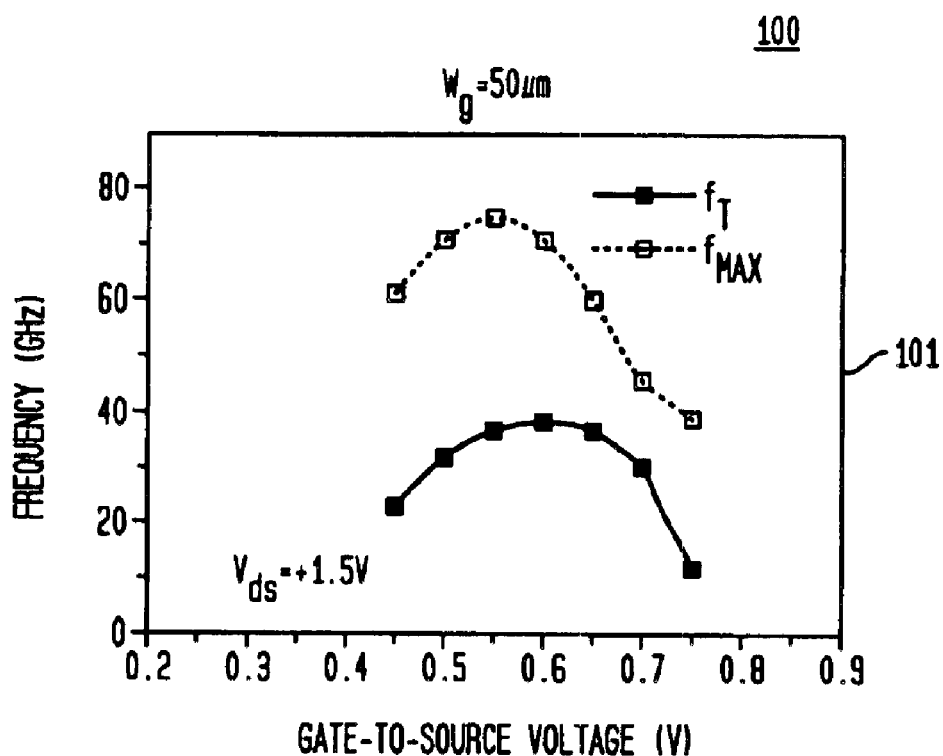
FIG. 17 illustrates a measured $f_T$ vs. $V_{gs}$ for a G1 device with $d_{Qw}$=25 nm, $L_g$=250 nm and a G2 device with $d_{Qw}$=15 nm, $L_g$=70 nm.
Figure 17B:
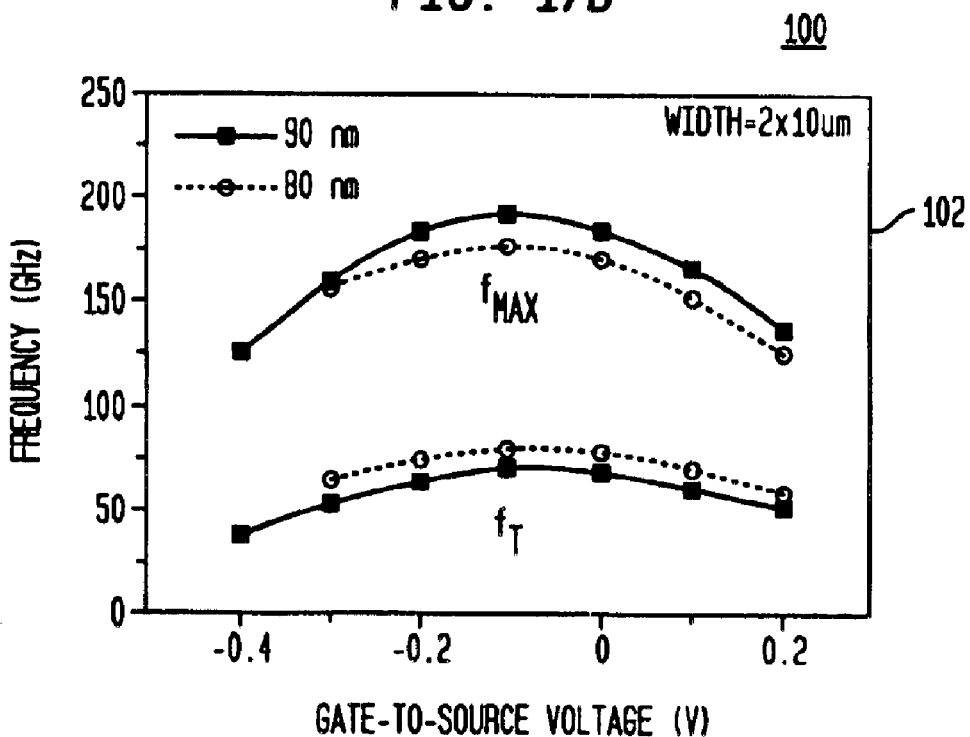

FIG. 17 shows the performance (measured $f_T$ vs. $V_{gs}$) curves 100 with the device scaling (i.e., for G1 and G2 devices). For example, FIG. 17 shows the $f_T$ curve for a G1 device with $d_{QW}$=25 nm, $L_g$=250 nm as compared to a G2 device with $d_{QW}$=15 nm, $L_g$=70 nm. As shown, in order to further improve the performance, the device has to be further scaled, both in the horizontal and vertical dimensions as in the G2 example shown in FIG. 17.

Figure 2:
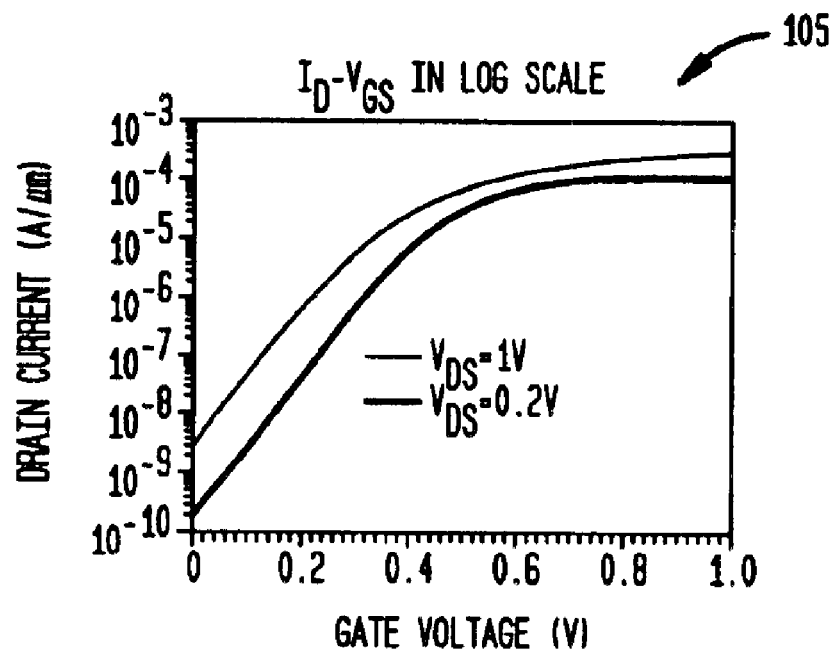
FIG. 2 illustrates a graph providing simulated $I_d$-$V_{gs}$ curves for the devices in FIGS. 1(a)–1(f) ($L_{gs}$=$L_g$=$L_{gd}$=50 nm)
Figure 3:
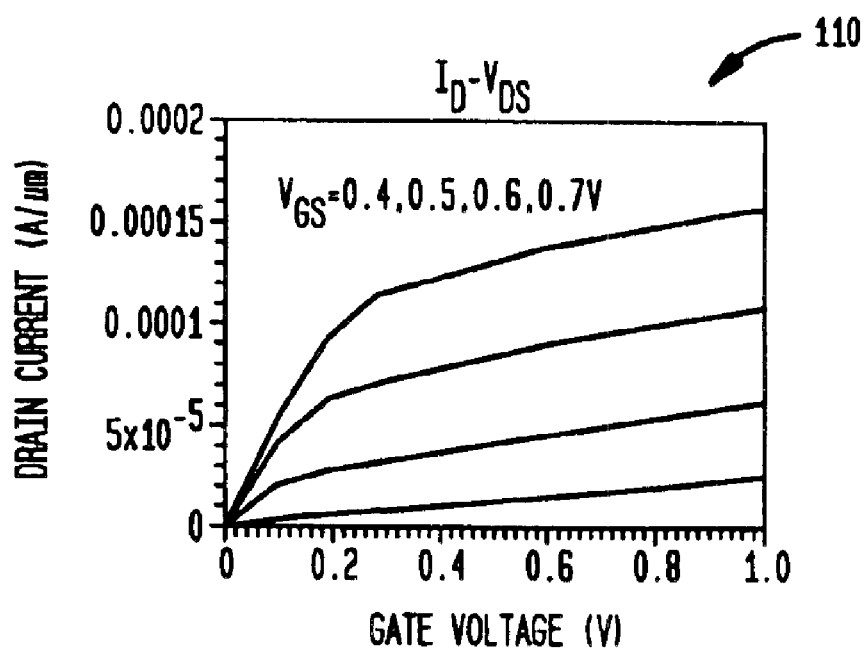
FIG. 3 depicts the simulated $I_d$-$V_{ds}$ curves for a G4 device of FIGS. 1(a)–1(f)
Figure 4:
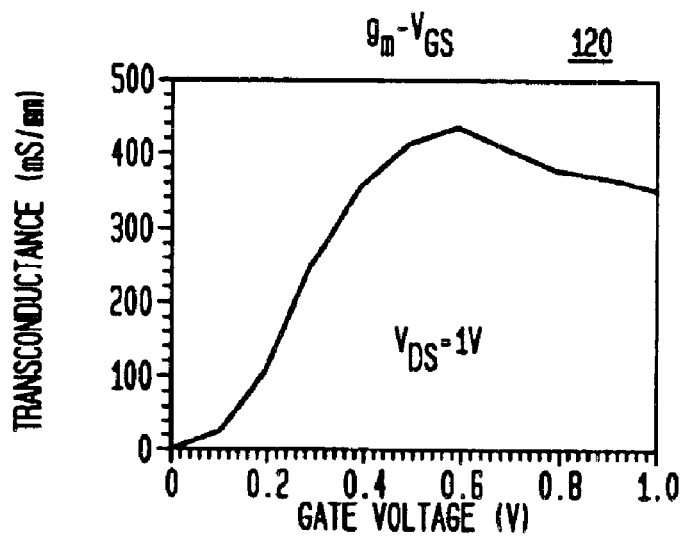
FIG. 4 depicts the simulated gm-$V_s$ curves for a G4 device of FIGS. 1(a)–1(f)
Figure 5:
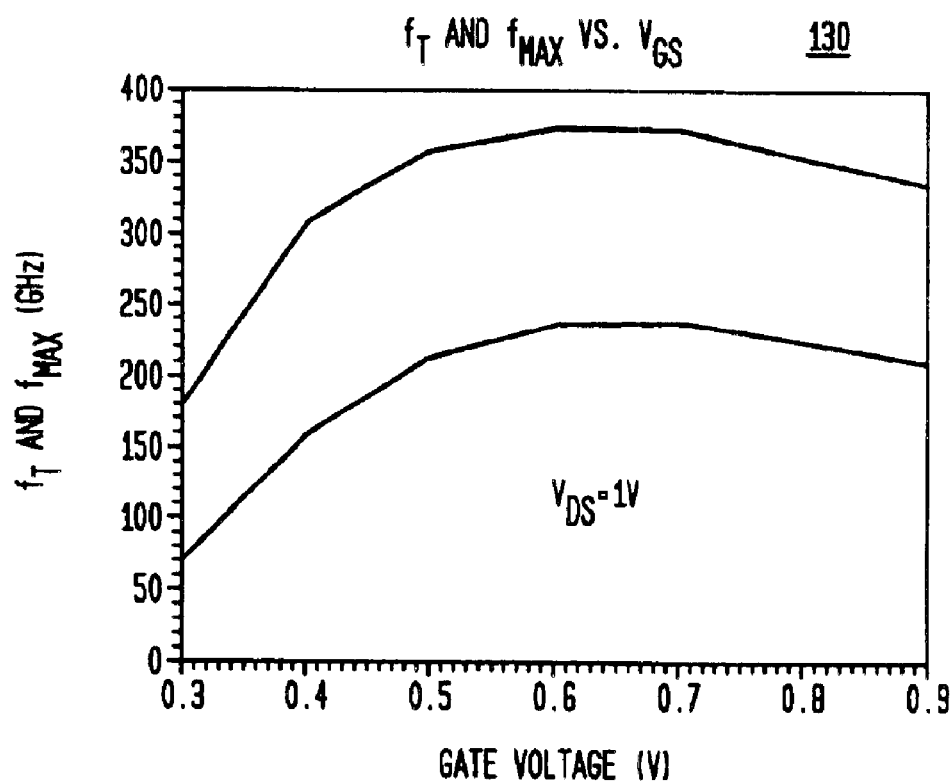
FIG. 5 depicts the simulated $f_T$ and $f_{max}$ vs. $V_{gs}$ curves for a G4 device of FIGS. 1(a)–1(f)

FIGS. 2–5 depict simulated device characteristics for the properly scaled devices of FIGS. 1(a)–1(f). FIG. 2 depicts the simulated Id-Vgs curves 105 for the G4 device of FIG. 1 where $L_{gs}=L_g=L_{gd}$=50 nm. FIG. 3 depicts the simulated $I_d$-$V_{ds}$ curves 110 for the G4 device of FIG. 1 and FIG. 4 depicts the simulated gm-$V_{gs}$ curves 120 for the G4 device in FIG. 1 ($L_{gs}=L_g=L_{gd}$=50 nm). As shown in FIG. 5, there is depicted the simulated $f_T$ and $f_{max}$ vs. $V_{gs}$ curves 130 for the device in FIG. 1 where $f_T$230 GHz and $f_{max}$=370 GHz can be achieved according to device simulations.

Figure 7:
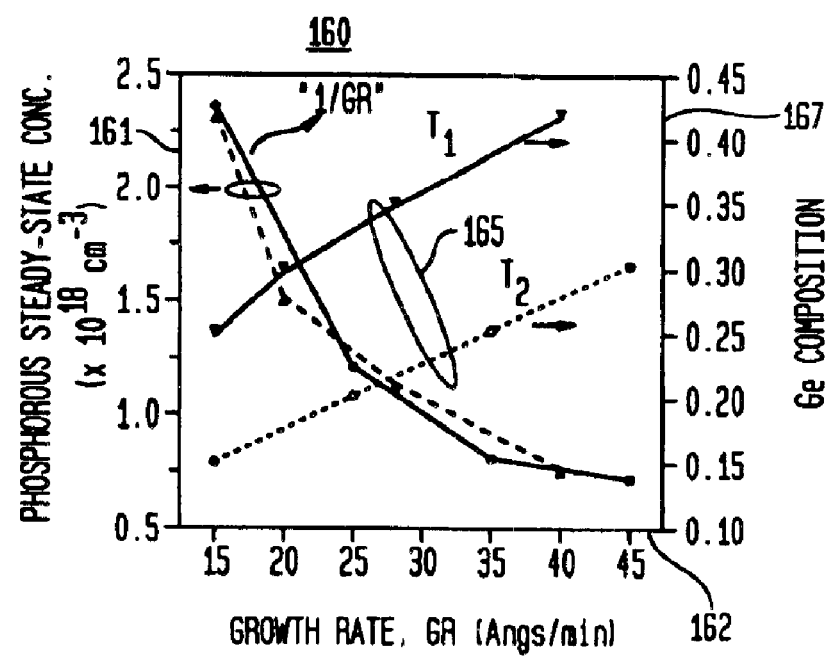
FIG. 7 illustrates a graph 160 depicting the steady-state P concentration vs. growth UHV CVD system according to the invention.

As mentioned hereinabove, experimentally it has been found that Phosphorus (P) doping can be controlled by the Ge content and its associated growth rate in a UHV CVD system. FIG. 7 illustrates a graph 160 depicting the steady-state P concentration 161 vs. growth rate in a UHVCVD 162 system.

As shown in the steady-state P concentration vs. growth rate graph of FIG. 7, in particular, the transient incorporation for P doping depicted by curves 165 is controlled by the Ge content 167 in a SiGe film. Likewise, the steady state P concentration is controlled by the associated growth rate of the SiGe film. The key process for achieving the abruptness of P profile is to use high Ge content but at a reduced growth rate, which is difficult since it is well known that high Ge is associated with enhanced or high growth rate.

Figure 8:
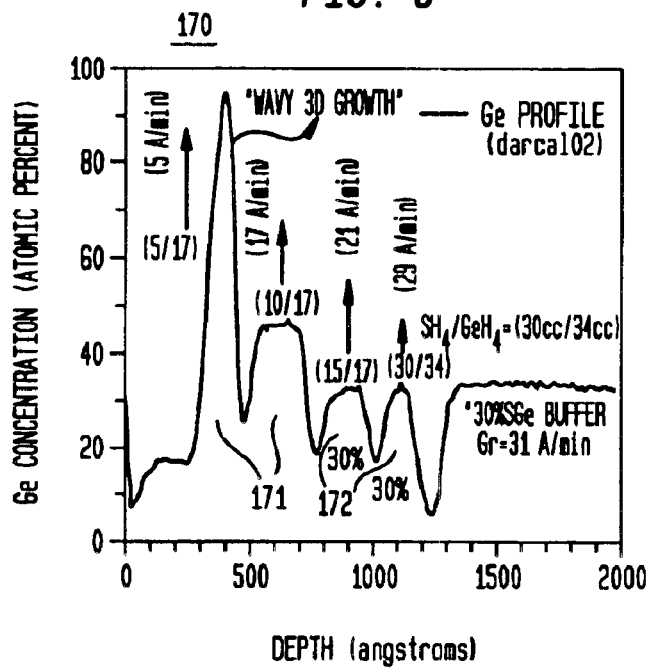
FIG. 8 depicts the method for calibrating growth rate reduction 170 for a SiGe (Ge content of 30%) according to the invention.
Figure 9:
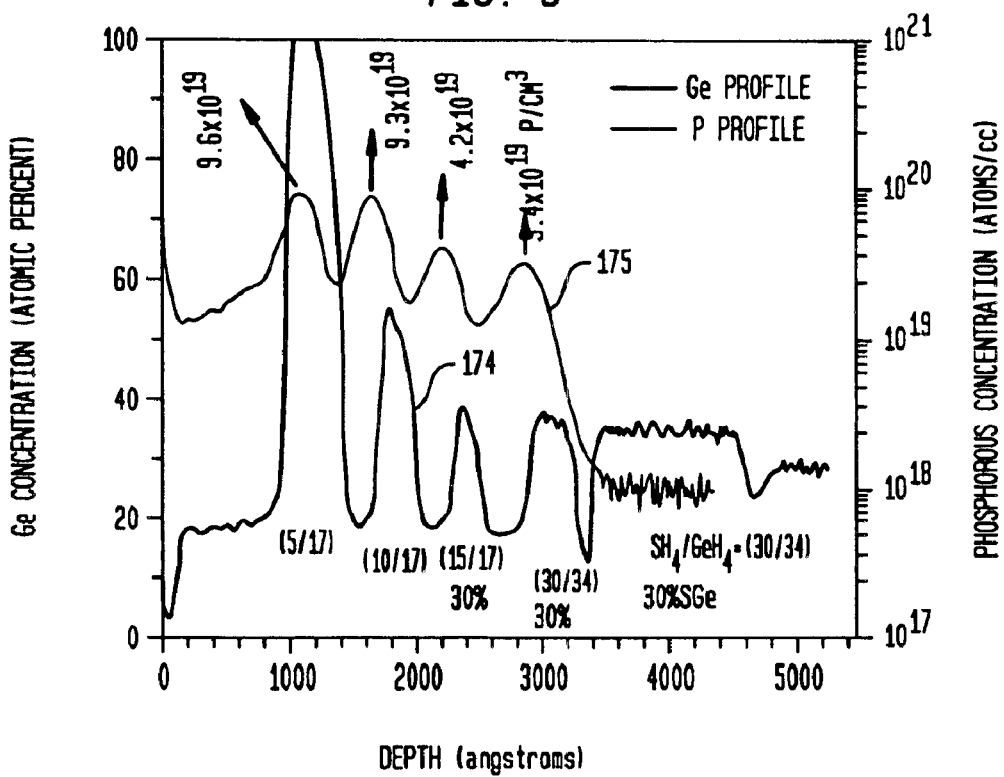
FIG. 9 illustrates an example plot indicating the steady state P concentration as a function of reduced growth rate.
Figure 10:
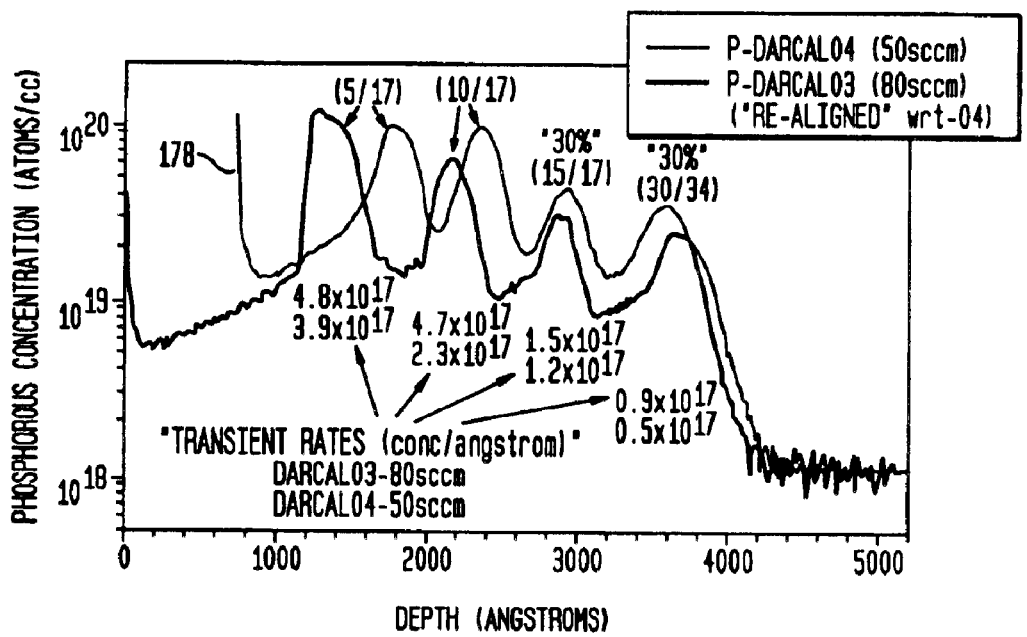
FIG. 10 is a graph illustrating the profile of transient P incorporation as a function of reduced growth rates.

The growth rate calibration 170 for a SiGe (Ge content of 30%) is shown in FIG. 8, for example, with a Ge concentration profile exhibiting successively smaller peaks 171, 172 as shown in the figure. Using the same calibration with the addition of PH3, the enhanced steady-state P concentration 175 is shown in FIG. 9 as a function of reduced SiGe growth rate depicted as curve 174. Similarly, as shown in the graph depicting transient P incorporation vs. reduced growth rates in FIG. 10, for the higher Ge content 177, the transient P incorporation rate is also increased as shown by the profile curve 178 in FIG. 10.

Figure 6:
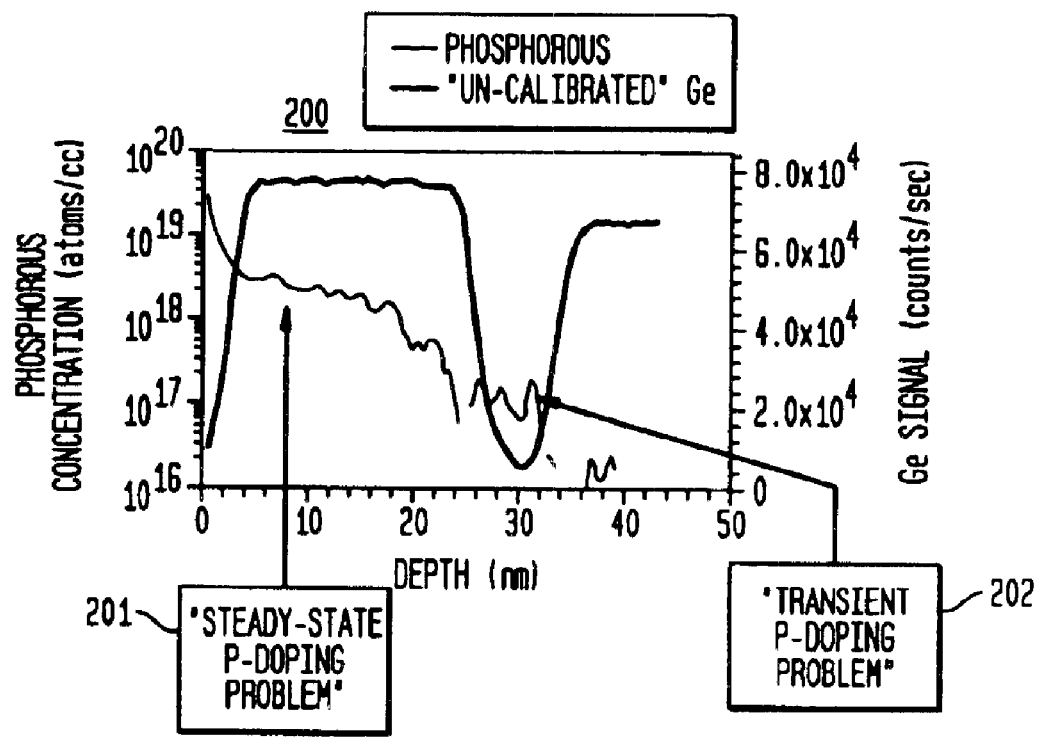
FIG. 6 depicts a SINS profile of the Phosphorus (P) doping profile for a G1 (generation) layer structure and the steady-state and transient P doping exhibited in a G1 layer structure.
Figure 13:
FIG. 13 depicts a XTEM for the G1 layer structure on bulk corresponding to the SIMS profiles shown in FIG. 6.

Using a reduced flow combination of SiH4 to GeH4 of (15 sccm/17 sccm), a G1 doping profile has been obtained just like secondary ion mass spectroscopy (SIMS) profiles 201, 202 as shown in FIG. 6. The corresponding cross-sectional transmission electron micrograph (XTEM) is shown in FIG. 13.

Figure 11:
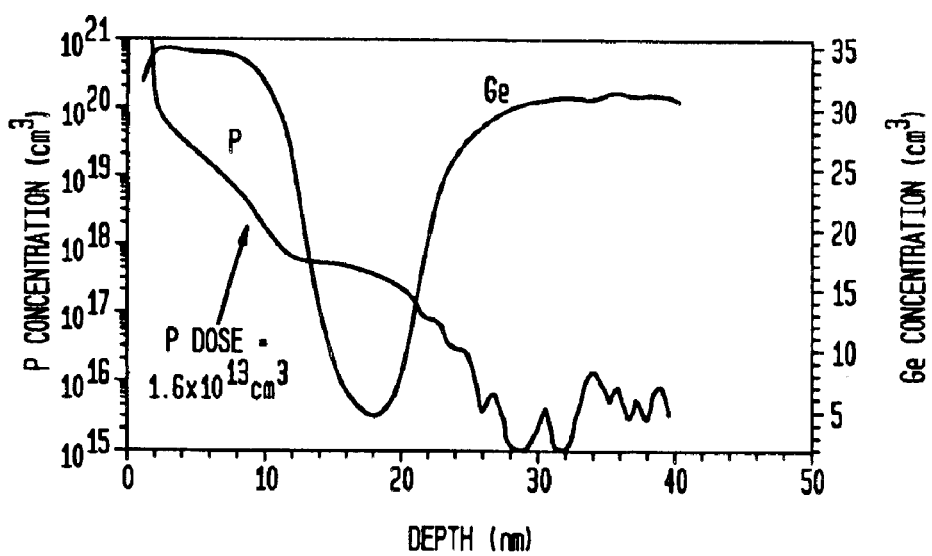
FIG. 11 depicts a SIMS profile of the Phosphorus P doping and Ge concentration exhibited in a G2 layer structure.
Figure 14:
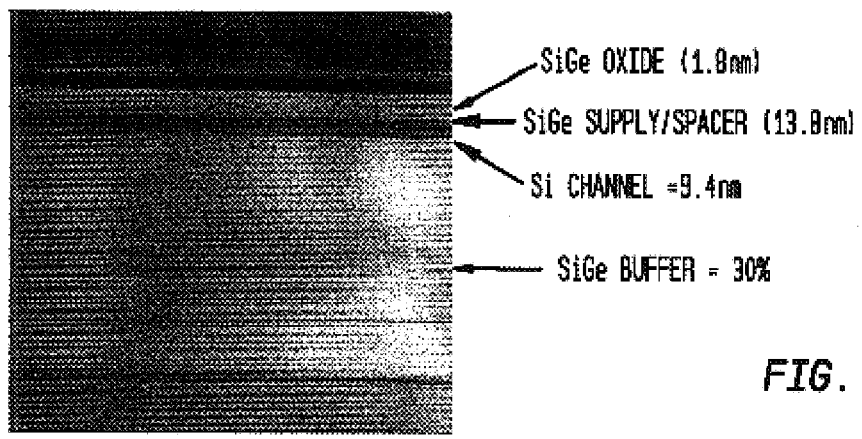
FIG. 14 depicts a XTEM for a G2 layer structure on bulk corresponding to the SIMS profiles shown in FIG. 11.

Using a lower flow combination SiH4 to GeH4 of (10/17), a G2 doping profile has been achieved as shown in the SIMS profiles P doping and Ge concentration profiles shown in FIG. 11. The corresponding XTEM is shown in FIG. 14.

Figure 12:
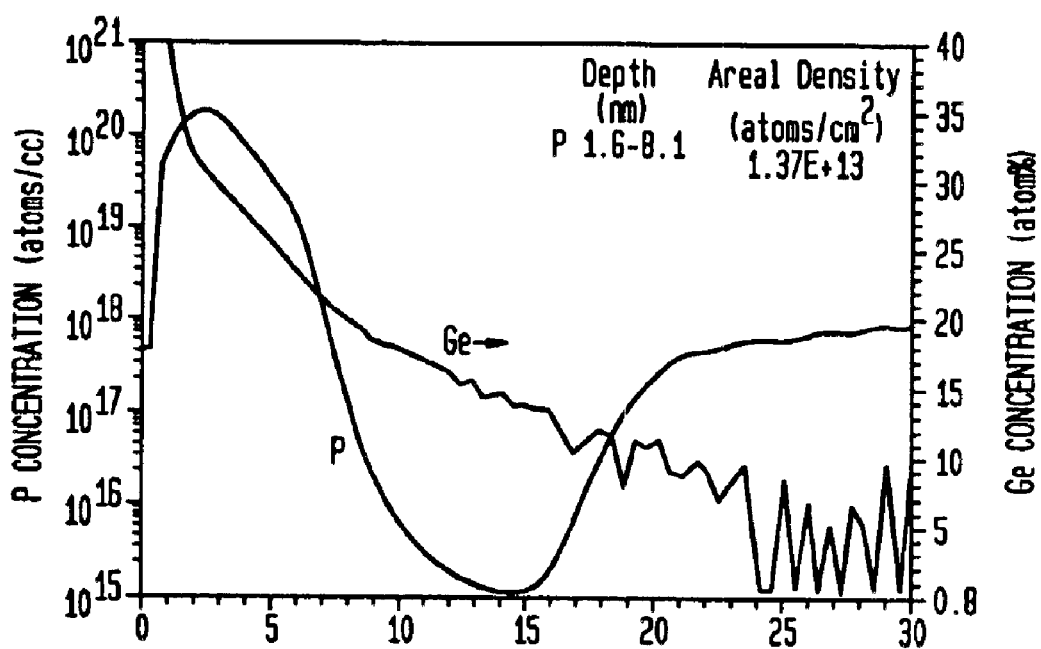
FIG. 12 depicts a SIMS profile of the Phosphorus P doping and Ge concentration exhibited in a G3 layer structure.
Figure 15:
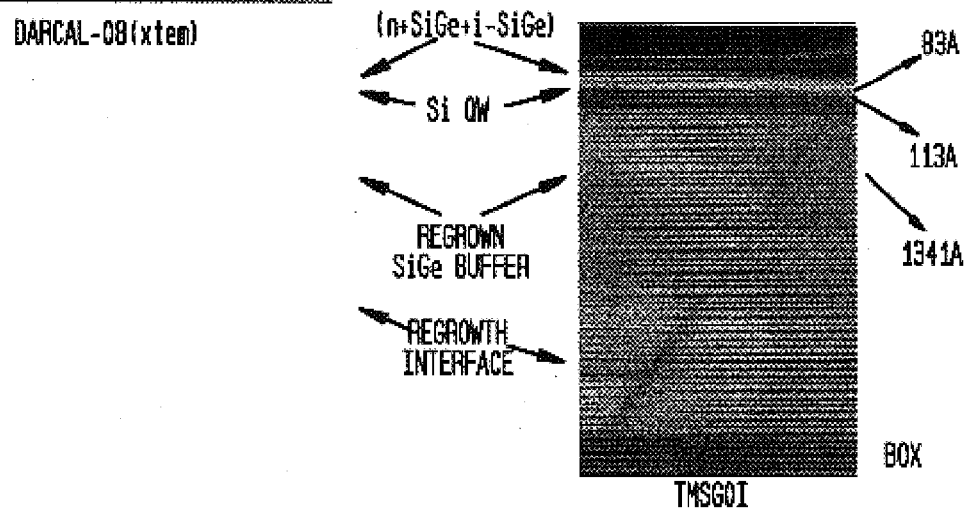
FIG. 15 depicts a XTEM for a G3 layer structure on a SGOI substrate with thin re-growth.

Using an even lower flow combination SiH4 to GeH4 of (8/10), a G3 doping profile has been achieved as shown in the SIMS profiles P doping and Ge concentration profiles shown in FIG. 12. The corresponding XTEM is shown in FIG. 15. FIG. 15 particularly depicts the XTEM for a G3 layer structure on a SGOI substrate with a transferred SiGe layer of 50 mm, where the regrown SiGe on transferred SiGe is thick (e.g., about 134.1 nm) in order to minimize the effects of carbon and oxygen at the regrowth interface. However, in order to make MODFETs on thin SGOI, one task is to make the regrown SiGe layer as thin as possible. A growth process has been developed using a 5% SiGe seed layer as described in the herein incorporated co-pending U.S. patent application Ser. No. 10/389,145.

Figure 16:
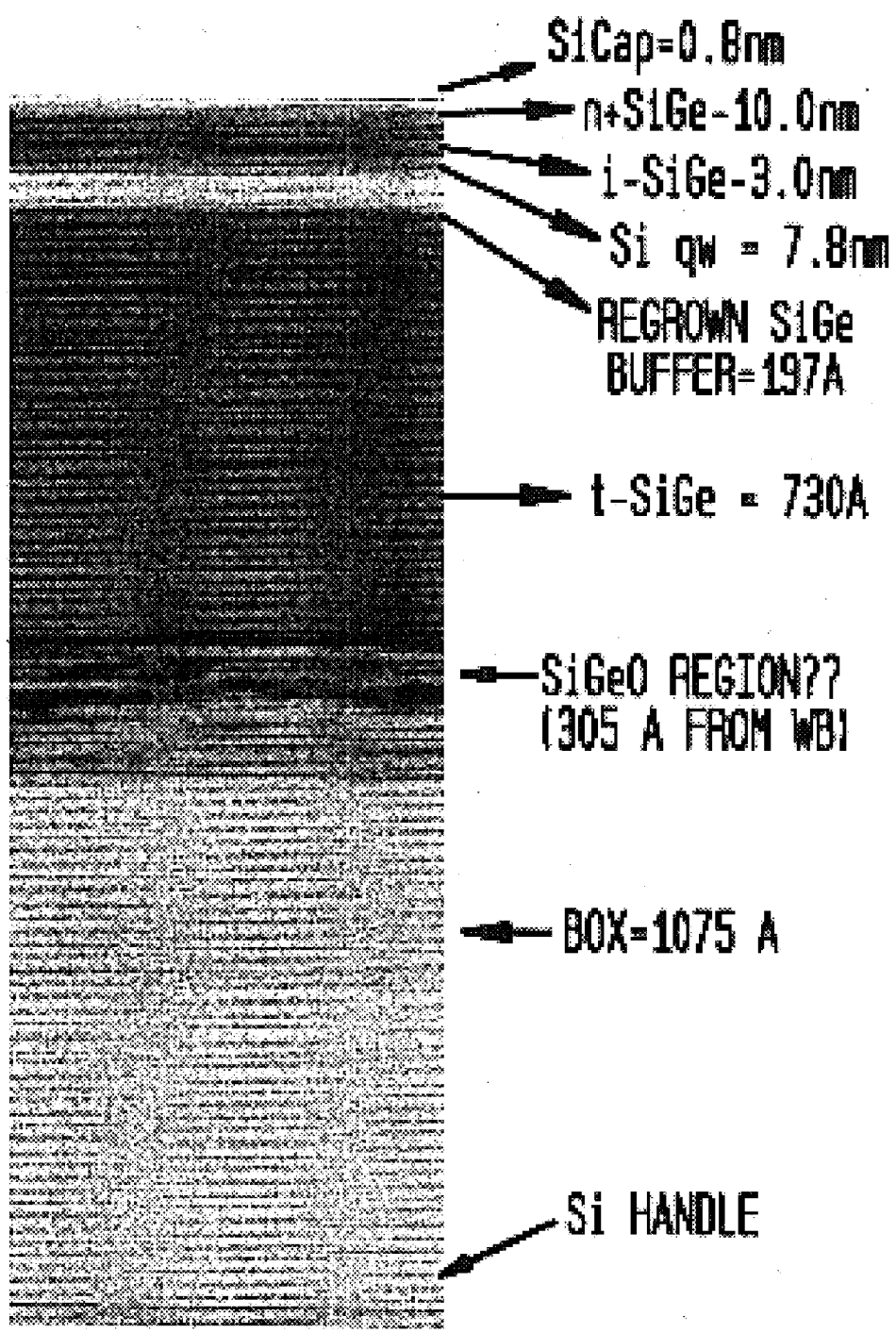
FIG. 16 depicts a XTEM for a G2 layer structure on a SGOI substrate.

FIG. 16 depicts a XTEM for a G2 layer structure on a SGOI substrate with a thin regrown SiGe layer (e.g., about 19.7 nm) on a SGOI substrate with a 73 nm thick transferred SiGe layer. It is advantageous to begin with a thin SGOI substrate which can be formed by a wafer bonding and thinning process as described in co-pending U.S. patent application Ser. No. 10/389,145.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

Having thus described our invention, what we claim as new, and desire to secure by Letters Patent is:

1. A high-electron-mobility layer semiconductor structure comprising:

an SGOI substrate comprising a SiGe layer on insulator having Ge content ranging between 30–40% and ranging in thickness between 20 nm–30 nm, and having a p-type doping concentration ranging between 1e14 $cm^{-3}$–5e17 $cm^{-3}$;

an epitaxial $Si_{0.95}Ge_{0.05}$ seed layer grown on top of said SiGe layer and ranging in thickness between 0 nm–5 nm;

a regrown $Si_{1-x}Ge_x$ buffer layer grown on top of said seed layer and ranging in thickness between 20 nm–30 nm and having Ge content x ranging between 10%–40%;

an epitaxial tensile strained Si layer grown on top of said buffer layer and ranging in thickness between 5 nm–7 nm;

an epitaxial $Si_{1-y}Ge_y$ spacer layer grown on top of said strained Si layer and ranging in thickness between 3 nm–5 nm and having Ge content y ranging between 30–40%;

an epitaxial $Si_{1-z}Ge_z$ supply layer grown on top of said spacer layer ranging in thickness between 2 nm–8 nm and having a n-type doping concentration ranging between 2e18 $cm^{-3}$–2e19 $cm^{-3}$ and having Ge content ranging between 35–50%; and, an epitaxial tensile strained Si cap layer grown on top of said supply layer ranging in thickness between 0 nm–3 nm and having a n-type doping concentration ranging between 5e17 $cm^{-3}$–5e19 $cm^{-3}$.

2. The high-electron-mobility layer semiconductor structure as claimed in claim 1, wherein said $Si_{1-y}Ge_y$ spacer layer includes a Ge content y=x+a, where "a" ranges between 0–20%.

3. The high-electron-mobility layer semiconductor structure as claimed in claim 1, wherein said $Si_{1-z}Ge_z$ supply layer includes a Ge content z=x+b, where "b" ranges between 0–30%.

4. The high-electron-mobility layer semiconductor structure as claimed in claim 1, wherein said $Si_{1-z}Ge_z$ supply layer comprises a $Si_{1-m-n}Ge_mC_n$ layer, where m=x+c, and "c" ranges between 0–20%, and "n" ranges between 0.1–2%.

5. The high-electron-mobility layer semiconductor structure as claimed in claim 1, further comprising:

a gate dielectric layer formed on top of said strained Si cap layer and having an equivalent oxide thickness in a range of 0–1 nm;

a gate conductor formed on top of said gate dielectric layer;

a drain region having a n-type doping concentration greater than 5e19 $cm^{-3}$; and, a source region having a n-type doping concentration greater than 5e19 $cm^{-3}$, wherein said structure forms a high-electron-mobility field effect transistor.

6. The high-electron-mobility field effect transistor as claimed in claim 5, wherein said $Si_{1-z}Ge_z$ supply layer ranges from about 5 nm–8 nm in thickness and has a sheet doping density of about 3e12 $cm^{-2}$.

7. The high-electron-mobility field effect transistor as claimed in claim 5, wherein said $Si_{1-z}Ge_z$ supply layer is about 4 nm in thickness and has a sheet doping density of about 2.4e12 $cm^{-2}$.

8. The high-electron-mobility field effect transistor as claimed in claim 6, wherein said $Si_{1-z}Ge_z$ supply layer comprises a SiGeC layer having a C content of about 1–1.5%.

9. The high-electron-mobility field effect transistor as claimed in claim 5, wherein said gate dielectric layer is selected from a group comprising: an oxide, nitride, oxynitride of silicon, and oxides and silicates of Hf, Al, Zr, La, Y, Ta, singly or in combinations thereof.

10. The high-electron-mobility field effect transistor as claimed in claim 5, wherein said gate conductor is selected from a group comprising: Pt, Ir, W, Pd, Al, Au, Cu, Ti, Co, singly or in combinations thereof.

11. The high-electron-mobility field effect transistor as claimed in claim 5, wherein said gate conductor is one of: a T-gate geometry, rectangular geometry or a multi-finger geometry.

12. The high-electron-mobility field effect transistor as claimed in claim 5, wherein a gate length ranges between 30 nm–100 nm.

13. The high-electron-mobility field effect transistor as claimed in claim 5, wherein a distance between said gate conductor and either said drain or source region ranges from about 20 nm–100 nm.

14. The high-electron-mobility field effect transistor as claimed in claim 5, further comprising a passivation layer surrounding the gate electrode, said passivation layer having a permittivity ranging between 1–4.

15. A high-electron-mobility field effect transistor comprising:
   an SGOI substrate comprising a SiGe layer on insulator having Ge content ranging between 30–40% and ranging in thickness between 20 nm–30 nm, and having a p-type doping concentration ranging between 1e14 cm$^{-3}$–5e17 cm$^{-3}$;
   a regrown $Si_{1-x}Ge_x$ buffer layer grown on top of said SiGe layer and ranging in thickness between 20 nm–30 nm, and having a Ge content x of 30–40%;
   an epitaxial tensile strained Si layer grown on top of said buffer layer and ranging in thickness between 5 nm–7 nm;
   an epitaxial $Si_{1-y}Ge_y$ spacer layer grown on top of said strained Si layer and ranging in thickness between 3 nm–5 nm and having Ge content ranging between 30–40%;
   an epitaxial $Si_{1-z}Ge_z$ supply layer grown on top of said spacer layer ranging in thickness between 2 nm–8 nm and having a n-type doping concentration ranging between 2e18 cm$^{-3}$–2e19 cm$^{-3}$ and having Ge content ranging between 35–50%;
   an epitaxial tensile strained Si cap layer grown on top of said supply layer ranging in thickness between 0 nm–3 nm and having a n-type doping concentration ranging between 5e17 cm$^{-3}$–5e19 cm$^{-3}$;
   a gate dielectric layer formed on top of said strained Si cap layer and having an equivalent oxide thickness in a range of 0–1 nm;
   a gate conductor formed on top of said gate dielectric layer;
   a drain region having a n-type doping concentration greater than 5e19 cmM$^3$; and,
   a source region having a n-type doping concentration greater than 5e19 cm$^{-3}$.

16. A high-electron-mobility layer semiconductor structure comprising:
   an SGOI substrate comprising a $Si_{1-x}Ge_x$ layer on insulator ranging in thickness between 10 nm–50 nm;
   an epitaxial $Si_{0.95}Ge_{0.05}$ seed layer grown on top of said SiGe layer and ranging in thickness between 0 nm–5 nm;
   an epitaxial $Si_{1-y}Ge_y$ supply layer grown on top of said seed layer ranging in thickness between 2 nm–8 nm and having a n-type doping concentration ranging between 1e18 cm$^{-1}$–5e19 cm$^{-3}$; and,
   an epitaxial $Si_{1-y}Ge_y$ spacer layer grown on top of said supply layer and ranging in thickness between 3 nm–5 nm;
   an epitaxial tensile strained Si layer grown on top of said spacer layer and ranging in thickness between 3 nm–10 nm;
   an epitaxial $Si_{1-y}Ge_y$ spacer layer grown on top of said strained Si layer and ranging in thickness between 1 nm–2 nm; and,
   an epitaxial tensile strained Si cap layer grown on top of said spacer layer ranging in thickness between 0 nm–2 nm.

17. The high-electron-mobility layer semiconductor structure as claimed in claim 16, wherein said SGOI substrate includes a $Si_{1-x}Ge_x$ layer with a Ge content x ranging between 30–50%.

18. The high-electron-mobility layer structure as claimed in claim 16, wherein said $Si_{1-z}Ge_z$ supply layer has a Ge content z=x+a, where "a" ranges between about 0–30% and x ranges between 30–50%.

19. The high-electron-mobility layer semiconductor structure as claimed in claim 16, wherein said $Si_{1-z}Ge_z$ supply layer comprises a $Si_{1-m-n}Ge_mC_n$ layer, where m=x+b, and "b" ranges between 0–30%, and "n" ranges between 0.1–2%.

20. The high-electron-mobility layer semiconductor structure as claimed in claim 16, wherein said $Si_{1-y}Ge_y$ spacer layer includes a Ge content y=x+c, where "c" ranges between 0–20%.

21. The high-electron-mobility layer semiconductor structure as claimed in claim 16, further comprising:
   a gate dielectric layer formed on top of said strained Si cap layer and having an equivalent oxide thickness in a range of 0–1 nm;
   a gate conductor formed on top of said gate dielectric layer;
   a drain region having a n-type doping concentration greater than 5e19 cm$^{-3}$; and,
   a source region having a n-type doping concentration greater than 5e19 cm$^{-3}$, wherein said structure forms a high-electron-mobility field effect transistor.

22. The high-electron-mobility layer semiconductor structure as claimed in claim 21, wherein said $Si_{1-z}Ge_z$ supply layer is about 5nm–8 nm in thickness and has a sheet doping density of about 3e12 cm$^{-2}$.

23. The high-electron-mobility layer semiconductor structure as claimed in claim 21, wherein said $Si_{1-z}Ge_z$ supply layer is about 4 nm in thickness and has a sheet doping density of about 2.4e12 cm$^{-2}$.

24. The high-electron-mobility layer semiconductor structure as claimed in claim 21, wherein said $Si_{1-z}Ge_z$ supply layer comprises a SiGeC layer having a C content of about 1–1.5%.

25. The high-electron-mobility layer semiconductor structure as claimed in claim 21, wherein said gate dielectric layer is selected from a group comprising: an oxide, nitride, oxynitride of silicon, and oxides and silicates of Hf, Al, Zr, La, Y, Ta, singly or in combinations thereof.

26. The high-electron-mobility layer semiconductor structure as claimed in claim 21, wherein said gate conductor is selected from a group comprising: Pt, Ir, W, Pd, Al, Au, Cu, Ti, Co, singly or in combinations thereof.

27. The high-electron-mobility layer semiconductor structure as claimed in claim 21, wherein said gate conductor is one of: a T-gate geometry, rectangular geometry or a multi-finger geometry.

28. The high-electron-mobility layer semiconductor structure as claimed in claim 21, wherein a gate length ranges between 30 nm–100 nm.

29. The high-electron-mobility layer semiconductor structure as claimed in claim 21, wherein a distance between said gate conductor and either said drain or source region ranges from about 20 nm–100 nm.

30. The high-electron-mobility layer semiconductor structure as claimed in claim 21, further comprising a passivation layer surrounding the gate electrode, said passivation layer having a permittivity ranging between 1–4.

31. A high-electron-mobility field effect transistor comprising:
an SGOI substrate comprising a SiGe layer on insulator having Ge content ranging between 30–40% and ranging in thickness between 20 nm–30 nm;
an epitaxial $Si_{1-z}Ge_z$ supply layer grown on top of said SiGe layer ranging in thickness between 2.5 nm–8 nm and having a n-type doping concentration ranging between $2e18$ $cm^{-3}$–$2e19$ $cm^{-3}$ and having Ge content ranging between 35–50%;
an epitaxial $Si_{1-y}Ge_y$ spacer layer grown on top of said supply layer and ranging in thickness between 3 nm–5 nm and having Ge content ranging between 30–40%;
an epitaxial tensile strained Si channel layer grown on top of said spacer layer ranging in thickness between 5 nm–7 nm and having a doping concentration less than $1e16$ $cm^{-3}$;
an epitaxial $Si_{1-y}Ge_y$ spacer layer grown on top of said Si channel layer and ranging in thickness between 1 nm–2 nm and having Ge content ranging between 30–40%;
an epitaxial tensile strained Si cap layer grown on top of said spacer layer ranging in thickness between 0 nm–2 nm;
a gate dielectric layer formed on top of said strained Si cap layer and having an equivalent oxide thickness in a range of 0–1 nm;
a gate conductor formed on top of said gate dielectric layer;
a drain region having a n-type doping concentration greater than $5e19$ $cm^{-3}$; and,
a source region having a n-type doping concentration greater than $5e19$ $cm^{-3}$.

32. A high-electron-mobility layer semiconductor structure comprising:
an SGOI substrate comprising a $Si_{1-z}Ge_z$ supply layer ranging in thickness between 2 nm–8 nm and having a n-type doping concentration ranging between $1e18$ $cm^{-3}$–$5e19$ $cm^{-3}$; and,
an epitaxial $Si_{1-y}Ge_y$ spacer layer grown on top of said supply layer and ranging in thickness between 3 nm–5 nm;
an epitaxial tensile strained Si layer grown on top of said spacer layer and ranging in thickness between 3 nm–10 nm;
an epitaxial $Si_{1-y}Ge_y$ spacer layer grown on top of said strained Si layer and ranging in thickness between 1 nm–2 nm; and,
an epitaxial tensile strained Si cap layer grown on top of said spacer layer ranging in thickness between 0 nm–2 nm.

33. The high-electron-mobility layer semiconductor structure as claimed in claim 32, wherein said SGOI substrate includes a Ge content "x" ranging between 30–50%.

34. The high-electron-mobility layer semiconductor structure as claimed in claim 32, wherein said doped transferred $Si_{1-z}Ge_z$ supply layer has a Ge content z=x+a, where "a" ranges between about 0–30% and may be formed by a wafer bonding and smart-cut process.

35. The high-electron-mobility layer semiconductor structure as claimed in claim 32, wherein said doped transferred $Si_{1-z}Ge_z$ supply layer comprises a $Si_{1-m-n}Ge_mC_n$ layer, where m=x+b, and "b" ranges between 0–30%, and "n" ranges between 0.1–2%.

36. The high-electron-mobility layer semiconductor structure as claimed in claim 32, wherein said $Si_{1-y}Ge_y$ spacer layer includes a Ge content y=x+c, where "c" ranges between 0–20%.

37. The high-electron-mobility layer semiconductor structure as claimed in claim 32, further comprising:
a gate dielectric layer formed on top of said strained Si cap layer and less than 1 nm in thickness;
a gate conductor formed on top of said gate dielectric layer;
a drain region having a n-type doping concentration greater than $5e19$ $cm^{-3}$; and,
a source region having a n-type doping concentration greater than $5e19$ $cm^{-3}$.

38. The high-electron-mobility layer semiconductor structure as claimed in claim 37, wherein said doped transferred $Si_{1-z}Ge_z$ supply layer is about 5 nm–8 nm in thickness and has a sheet doping density of about 3e12 cm-2.

39. The high-electron-mobility layer semiconductor structure as claimed in claim 37, wherein said doped transferred $Si_{1-z}Ge_z$ supply layer is about 4 nm in thickness and has a sheet doping density of about 2.4e12 cm-2.

40. The high-electron-mobility layer semiconductor structure as claimed in claim 32, wherein said doped transferred $Si_{1-z}Ge_z$ supply layer comprises a SiGeC layer having a C content of about 1–1.5%.

41. The high-electron-mobility layer semiconductor structure as claimed in claim 37, wherein said gate dielectric layer is selected from a group comprising: an oxide, nitride, oxynitride of silicon, and oxides and silicates of Hf, Al, Zr, La, Y, Ta, singly or in combinations thereof.

42. The high-electron-mobility layer semiconductor structure as claimed in claim 37, wherein said gate conductor is selected from a group comprising: Pt, Ir, W, Pd, Al, Au, Cu, Ti, Co, singly or in combinations thereof.

43. The high-electron-mobility layer semiconductor structure as claimed in claim 37, wherein said gate conductor is one of: a T-gate geometry, rectangular geometry, or a multi-finger geometry.

44. The high-electron-mobility layer semiconductor structure as claimed in claim 37, wherein a gate length ranges between 30 nm–100 nm.

45. The high-electron-mobility layer semiconductor structure as claimed in claim 37, wherein a distance between said gate conductor and either said drain or source region ranges from about 20 nm–100 nm.

46. The high-electron-mobility layer semiconductor structure as claimed in claim 37, further comprising a passivation layer surrounding the gate electrode, said passivation layer having a permittivity ranging between 1–4.

47. A high-electron-mobility layer semiconductor structure comprising:
an SGOI substrate comprising a SiGe layer on insulator ranging in thickness between 10 nm–50 nm, and having a n-type doping concentration ranging between $1e17$ $cm^{-3}$–$5e19$ $cm^{-3}$;
a $Si_{1-x}Ge_x$ regrown buffer layer grown on top of said SiGe layer and ranging in thickness between 10 nm–50 nm and serving as a bottom spacer layer;

an epitaxial tensile strained Si layer grown on top of said regrown buffer layer and ranging in thickness between 3 nm–10 nm;

an epitaxial $Si_{1-y}Ge_y$ spacer layer grown on top of said strained Si layer and ranging in thickness between 3 nm–5 nm;

an epitaxial $Si_{1-z}Ge_z$ supply layer grown on top of said spacer layer ranging in thickness between 2 nm–8 nm and having a n-type doping concentration ranging between 1e18 $cm^{-3}$–5e19 $cm^{-3}$; and, an epitaxial tensile strained Si cap layer grown on top of said supply layer ranging in thickness between 0 nm–3 nm and having a n-type doping concentration ranging between 5e17 $cm^{-3}$–5e19 $cm^{-3}$.

48. The high-electron-mobility layer semiconductor structure as claimed in claim 47, wherein said SGOI substrate includes a Ge content ranging between 30–50%.

49. The high-electron-mobility layer semiconductor structure as claimed in claim 47, wherein said $Si_{1-x}Ge_x$ regrown buffer layer includes a Ge content x ranging between 10–35%.

50. The high-electron-mobility layer semiconductor structure as claimed in claim 47, wherein said $Si_{1-y}Ge_y$ spacer layer includes a Ge content y=x+a, where "a", ranges between 0–20%.

51. The high-electron-mobility layer semiconductor structure as claimed in claim 47, wherein said $Si_{1-z}Ge_z$ supply layer includes a Ge content z=x+b, where "b" ranges between 0–30%.

52. The high-electron-mobility layer semiconductor structure as claimed in claim 47, wherein said $Si_{1-z}Ge_z$ supply layer comprises a $Si_{1-m-n}Ge_mC_n$ layer, where m=x+c, and "c" ranges between 0–20%, and "n" ranges between 0.1–2%.

53. The high-electron-mobility layer semiconductor structure as claimed in claim 47, further comprising:

a gate dielectric layer formed on top of said strained Si cap layer and having an equivalent oxide thickness in a range of 0–1 nm;

a gate conductor formed on top of said gate dielectric layer;

a drain region having a n-type doping concentration greater than 5e19 $cm^{-3}$; and, a source region having a n-type doping concentration greater than 5e19 $cm^{-3}$.

54. The high-electron-mobility layer semiconductor structure as claimed in claim 53, wherein said $Si_{1-z}Ge_z$ supply layer is about 5 nm–8 nm in thickness and has a sheet doping density of about 3e12 cm-2.

55. The high-electron-mobility layer semiconductor structure as claimed in claim 53, wherein said $Si_{1-z}Ge_z$ supply layer is about 4 nm in thickness and has a sheet doping density of about 2.4e12 cm-2.

56. The high-electron-mobility layer semiconductor structure as claimed in claim 54, wherein said $Si_{1-z}Ge_z$ supply layer comprises a SiGeC layer having a C content of about 1–1.5%.

57. The high-electron-mobility layer semiconductor structure as claimed in claim 53, wherein said gate dielectric layer is selected from a group comprising: an oxide, nitride, oxynitride of silicon, and oxides and silicates of Hf, Al, Zr, La, Y, Ta, singly or in combinations thereof.

58. The high-electron-mobility layer semiconductor structure as claimed in claim 53, wherein said gate conductor is selected from a group comprising: Pt, Ir, W, Pd, Al, Au, Cu, Ti, Co, singly or in combinations thereof.

59. The high-electron-mobility layer semiconductor structure as claimed in claim 53, wherein said gate conductor is one of: a T-gate, rectangular, or multi-finger geometry.

60. The high-electron-mobility layer semiconductor structure as claimed in claim 53, wherein a gate length ranges between 30 nm–100 nm.

61. The high-electron-mobility layer semiconductor structure as claimed in claim 53, wherein a distance between said gate conductor and either said source or drain region ranges from about 20 nm–100 nm.

62. The high-electron-mobility layer semiconductor structure as claimed in claim 53, further comprising a passivation layer surrounding the gate electrode, said passivation layer having a permittivity ranging between 1–4.

63. A high-hole-mobility layer semiconductor structure comprising:

an SGOI substrate comprising an epitaxial $Si_{1-j}Ge_j$ supply layer ranging in thickness between 5 nm–25 nm, and having a p-type doping concentration ranging between 1e18–5e19 $cm^{-3}$;

an epitaxial $Si_{1-k}Ge_k$ spacer layer grown on top of said supply layer and ranging in thickness between 3 nm–7 nm;

an epitaxial compressively strained $Si_{1-m}Ge_m$ channel layer grown on top of said spacer layer and ranging in thickness between 5 nm–20 nm; and, an epitaxial strained $Si_{1-n}Ge_n$ cap layer grown on top of said strained $Si_{1-m}Ge_m$ channel layer and ranging in thickness between 2 nm–10 nm.

64. The high-hole-mobility layer semiconductor structure as claimed in claim 63, wherein said $Si_{1-j}Ge_j$ supply layer includes a Ge content j ranging between 30–70%.

65. The high-hole-mobility layer semiconductor structure as claimed in claim 63, wherein said $Si_{1-k}Ge_k$ spacer layer includes a Ge content k ranging between 30–70%.

66. The high-hole-mobility layer semiconductor structure as claimed in claim 63, wherein said $Si_{1-m}Ge_m$ channel layer includes a Ge content m ranging between 60–100%.

67. The high-hole-mobility layer semiconductor structure as claimed in claim 63, wherein said stained $Si_{1-n}Ge_n$ cap layer includes a Ge content n ranging between 0%–30%.

68. The high-hole-mobility layer semiconductor structure as claimed in claim 63, further comprising:

a gate conductor formed on top of said gate dielectric layer;

a drain region having a p-type doping concentration greater than 5e19 $cm^{-3}$; and, a source region having a p-type doping concentration greater than 5e19 $cm^{-3}$.

69. The high-hole-mobility layer semiconductor structure as claimed in claim 68, wherein said gate dielectric layer is selected from a group comprising: an oxide, nitride, oxynitride of silicon, and oxides and silicates of Hf, Al, Zr, La, Y, Ta, singly or in combinations thereof.

70. The high-hole-mobility layer semiconductor structure as claimed in claim 68, wherein said gate conductor is selected from a group comprising: Pt, Ir, W, Pd, Al, Au, Cu, Ti, Co, singly or in combinations thereof.

71. The high-hole-mobility layer semiconductor structure as claimed in claim 68, wherein said gate conductor is one of: a T-gate, rectangular, or multi-finger geometry.

72. The high-hole-mobility layer semiconductor structure as claimed in claim 68, wherein a gate length ranges between 30 nm–100 nm.

73. The high-hole-mobility layer semiconductor structure as claimed in claim 68, wherein a distance between said gate conductor and either said drain or source region ranges from about 20 nm–100 nm.

74. The high-hole-mobility layer semiconductor structure as claimed in claim 68, further comprising a passivation layer surrounding the gate electrode, said passivation layer having a permittivity ranging between 1–4.

* * * * *